STEEPING TUBE READ-IN CIRCUIT EMPLOYING GATES TO SELECTIVELY INHIBIT LOWER ORDER COUNTERS TO EFFECT MORE EFFICIENT READ-IN OF ADDITIONAL NUMBERS

Original Filed Dec. 19, 1963 3 Sheets-Sheet 1

INVENTORS
GERALD O. CROWTHER
GRAHAM F. JEYNES
BY Frank R. Trifari
AGENT

INVENTORS
GERALD O. CROWTHER
GRAHAM F. JEYNES
BY Frank R. Trifari
AGENT

STEEPING TUBE READ-IN CIRCUIT EMPLOYING GATES TO SELECTIVELY INHIBIT LOWER ORDER COUNTERS TO EFFECT MORE EFFICIENT READ-IN OF ADDITIONAL NUMBERS

Original Filed Dec. 19, 1963 3 Sheets-Sheet 3

INVENTORS
GERALD O. CROWTHER
GRAHAM F. JEYNES
BY Frank R. Trifari
AGENT

United States Patent Office

Re. 26,822
Reissued Mar. 17, 1970

26,822

STEPPING TUBE READ-IN CIRCUIT EMPLOYING GATES TO SELECTIVELY INHIBIT LOWER ORDER COUNTERS TO EFFECT MORE EFFICIENT READ-IN OF ADDITIONAL NUMBERS

Gerald Offley Crowther and Graham Frank Jeynes, Cheam, England, assignors, by mesne assignments, to U.S. Philips Corporation, New York, N.Y., a corporation of Delaware Original No. 3,303,384, dated Feb. 7, 1967, Ser. No. 331,677, Dec. 19, 1963. Application for reissue Feb. 3, 1969, Ser. No. 802,288
Claims priority, application Great Britain, Dec. 19, 1962, 47,957/62
Int. Cl. H01j *17/36*
U.S. Cl. 315—84.5 4 Claims

Matter enclosed in heavy brackets [ ] appears in the original patent but forms no part of this reissue specification; matter printed in italics indicates the additions made by reissue.

*ABSTRACT OF THE DISCLOSURE*

*A cold cathode stepping tube counting circuit including gating means between stepping tube stages for providing a carry from a lower order stage to a higher order stage, and an interstage gating circuit for inhibiting lower order stages upon external introduction of a counting pulse to a higher order stage.*

Figure 1:
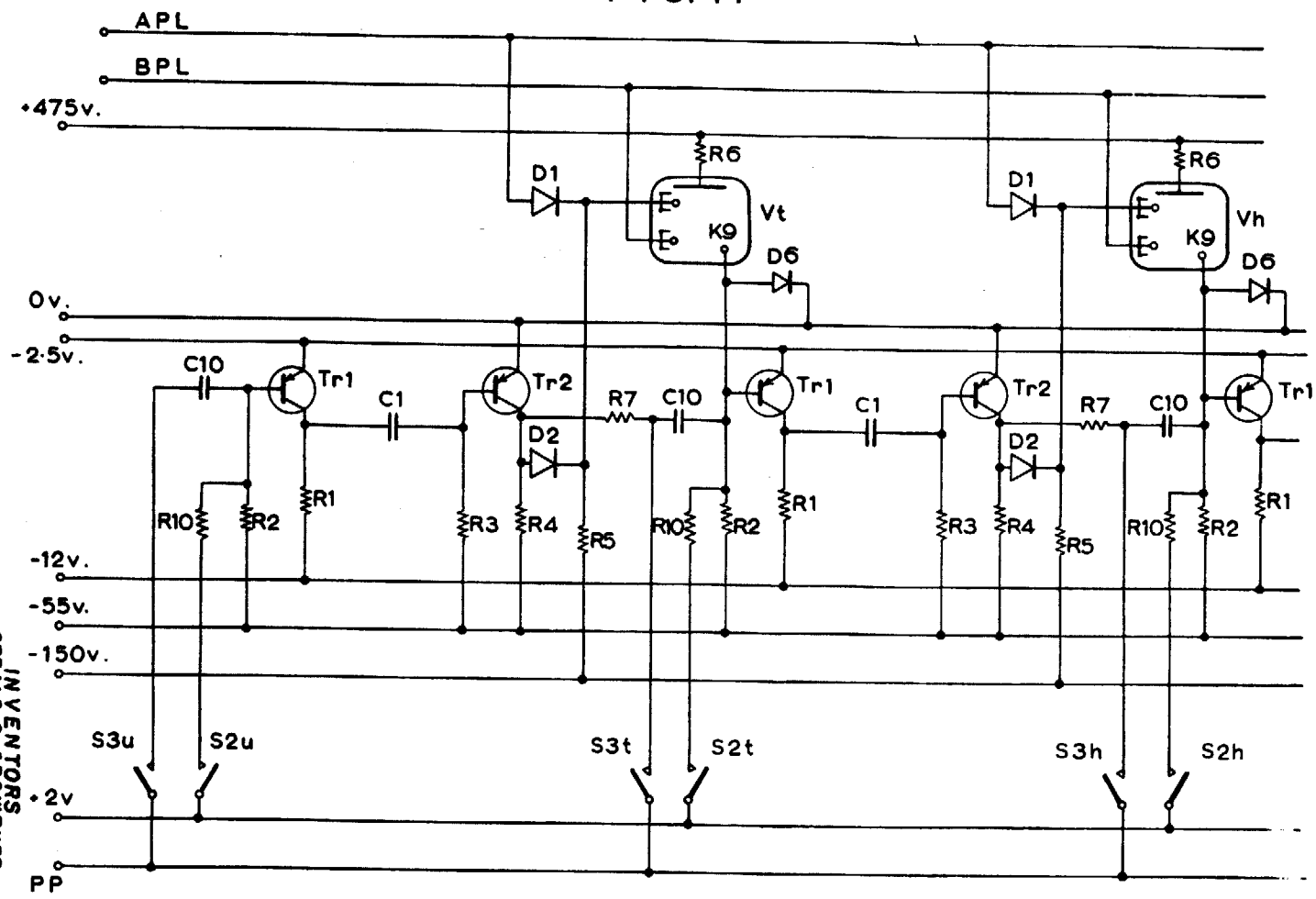

This invention relates to counting circuits and more particularly to cold-cathode stepping-tube counting-circuits which may be used in small computing machines.

The term "stepping tube" is herein used to define a tube having an electrode assembly comprising a common electrode, a plurality of switching electrodes and a plurality of further electrodes, wherein a stream of electrons and ions may be caused to travel between the common electrode and one of the further electrodes and wherein one end of the stream of electrons may be caused to move from one to another of the further electrodes in a predetermined sequence by the application of suitable potentials to the switching electrodes.

Usually the central electrode is circular and functions as an anode, the other electrodes being arranged in a circular row, and when in use, being returned to a potential more negative than that to which the anode is returned. These other electrodes thus may correctly be regarded as cathodes; however, each position in the tube usually has associated with it three or four of these electrodes and it is convenient to distinguish them by referring to those on which the glow discharge rests between pulses as "main cathodes" or "cathodes" and to refer to the other electrodes as "guide electrodes" or "guides."

In known stepping tubes the transfer of the discharge from its rest position on one cathode to its rest position on the next cathode is thus effected by means of a plurality of guide electrodes; where there are two guide electrodes between adjacent cathodes the guide next to the cathode in the direction of rotation of the discharge is usually termed the "first" or "A" guide and the next guide again in the direction of rotation of the discharge is termed the "second" or "B" guide. Throughout this specification the terms "A" guide and "B" guide will be used. In these known tubes all the A guides are usually connected together or "commoned" inside the envelope and all the B guides are similarly connected together; in operation the discharge is transferred in its entirety from its rest position on one cathode to an A guide, then from the said A guide to a B guide and finally from the B guide to the next cathode.

The invention is directed towards a provision of a circuit arrangement for providing a "read-in" facility by means of which a number may be added to a number already stored in the counting circuit.

When it is desired to add two numbers together in such a machine, that is to say when it is desired to add to a number already stored in a portion of the machine a second number, then it is often inconvenient to add this number by means of single digit pulses. Thus for instance suppose the number to be added, the second number referred to above, is a four figure number. To add this number by unit digits it will be necessary to count some thousands of digit pulses into the stored number before the addition process is applied. However if the number were added separately "units," "tens," "hundreds" and "thousands" digits into the appropriate decade stages of the store, the greatest number of pulses then necessary would be nine for each decade or a total number of thirty-six for the four decades. Such a process would obviously be much quicker and more convenient than adding the two numbers together by a succession of "unit" digits.

According to one aspect of the present invention a cold-cathode stepping-tube counting-circuit including a chain of cold-cathode stepping-tubes arranged in cascade operates to count a succession of pulses and to store the number thus counted. Means are present between each pair of successive stepping-tube stages for providing a "carry" facility from one stage to the next following stage of higher order, and for selectively inhibiting the stepping of those stages preceding a selected stage so that, when it is desired to add a second number to a number already stored in the chain, digits can be added separately to separate stages of the stepping-tube chain without affecting other stages.

According to another aspect of the invention, the counting-circuit includes means for inhibiting the operation of the earliest, lowest order stage whereby a second number can be counted into the chain without stepping the said earliest stage.

Figure 2:
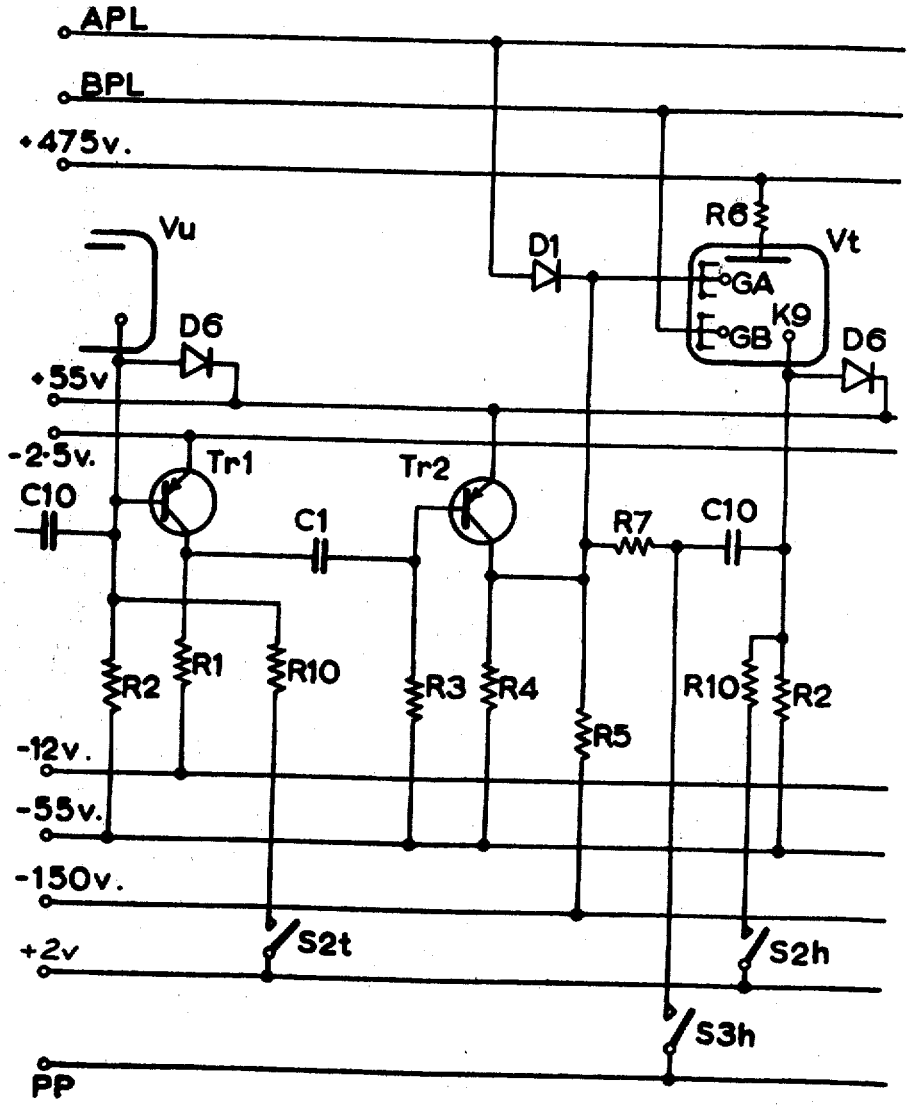
Figure 3:
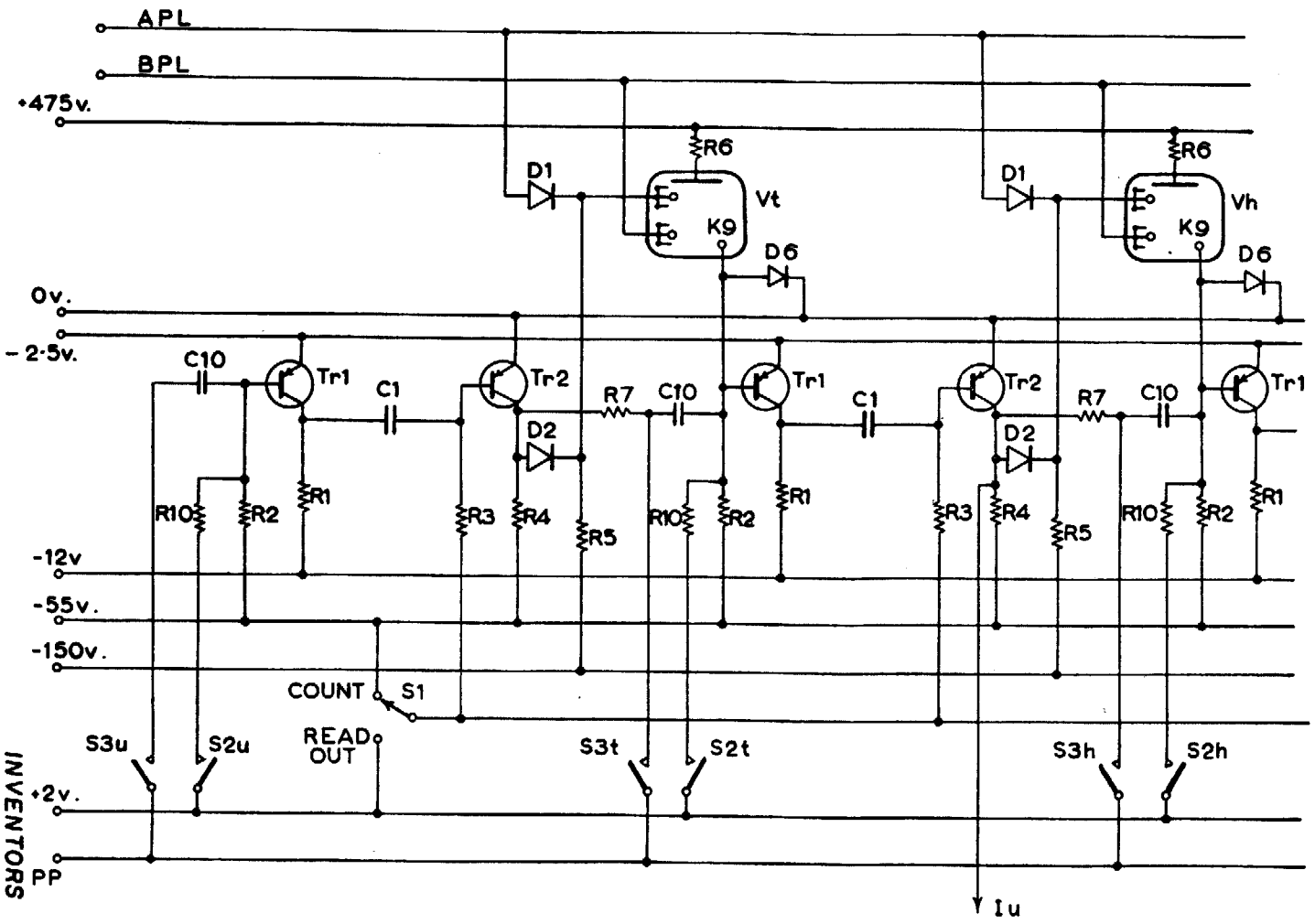

Embodiments of the invention will now be described with reference to the accompanying diagrammatic drawings in which, FIGURE 1 is a circuit diagram of a first embodiment, FIGURE 2 is a circuit diagram of a second embodiment, and FIGURE 3 is a circuit diagram illustrating additional features.

Referring now to FIGURE 1 this illustrates a chain of cold-cathode stepping-tubes which are operative to count input pulses fed to the chain; these tubes will hereinafter be referred to as counting-tubes. As described in our copending applications Ser. Nos. 331,676 and 331,678, both filed Dec. 19, 1963, the counting chain is arranged to receive A guide pulses along an A pulse line APL and B guide pulses along a B pulse line BPL. "Pre-pulses" are supplied from a pre-pulse line PP to the ninth cathodes K9 of each of the counting tubes so as to provide "carry" pulses from each stage to the next succeeding stage, the inter-stage couplings each comprising a 100K ohm resistor R7 and a 20 pf. capacitor C10. The operation of this circuit is described in the specifications referred to above and will not be repeated herein except in so far as it directly concerns the present invention.

If it is desired to "read-in" a number other than a "units" number it is necessary to inhibit all stages, prior to the stage into which the number is to be read, from responding to the read-in pulses. Thus for instance if we wish to read-in the number "800" then we can do this by stepping the "hundreds" digit eight times but we must at the same time ensure that the tens and the units tubes are not stepped. A further requirement however is that the normal "carry" facility from one stage to the next succeeding stage should remain unaffected so that if we read-in "800" the hundreds stage must be able, if necessary, to provide a carry pulse to step the "thousands" stage on when the hundreds stage reaches the digit "zero."

This facility is provided in FIGURE 1 by providing a positive line, suitably 2 volt as indicated on the figure, to which the ninth cathode K9 of each counting tube can be returned when it is desired to inhibit stepping of the next succeeding counting tube. This is effected by providing a resistor R10 connected to the K9 cathode of each counting tube, each resistor R10 being connectable through an individual switch S2 to a 2 volt positive line. In order to inhibit the units tube Vu from being stepped by read-in pulses applied along the A, the B, and the pre-pulse lines, the pre-pulses are applied to the A guides of Vu through a first gate circuit comprising a transistor Tr1 and a second gate circuit comprising a transistor Tr2 and diodes D1 and D2. These two gate circuits are identical to the inter-stage gates the operation of which and the component values for which are described in the aforesaid U.S. Application Serial No. 331,676. The junction of each resistor R7 and capacitor C10 is connected through a switch S2 to a common pre-pulse line: at the input to the gate circuits preceding the units tube Vu the resistor R7 is omitted. Certain of the circuit components appertaining to the "units," "tens" and "hundreds" stages have been indicated by the suffixes u, t and h respectively.

First of all consider the operation of the circuit when it is desired to count pulses into the units stage in a manner similar to that described in our co-pending U.S. application 331,676. To do this the base of Tr1 in the gate preceding the units tube Vu is raised to a positive voltage of 2 volts by closing switch S2u and this switches off Tr1 so that it becomes non-conducting. At the same time switch S3u is also closed so that pre-pulses appearing on the common pre-pulse line can now be applied through capacitor C10 to the base of Tr1. When a pre-pulse now appears on the common pre-pulse line and is applied through S3u and C10 to the base of this transistor Tr1 it causes Tr1 to conduct which in turn causes Tr2 to cut off and to open the gate formed by Tr2, D1 and D2 thus permitting the A pulse, which follows shortly after the pre-pulse, to be applied in full to the A guides GA of tube Vu as described in the above-mentioned application. Thus for normal counting, that is to say when the pulses to be counted are applied to the units stage, the circuit functions in a way that is identical with the circuit described in the above-mentioned application except that gate circuits are provided not only between stepping-tube stages but also in front of the first stage. The provision of the resistor R7 in series with the capacitor C10 does not substantially alter the inter-stage coupling.

Consider now a situation where it is desired to step the tens tube Vt, and to perform the usual "carry" operations down the chain, that is to say in the succeeding stages. This kind of operation may arise where it is desired, for instance, to count into the chain a number such as "80" where the counting of eight digits each representing "ten" can be accomplished much more quickly than the counting of eighty digits each representing "one." To do this switches S2t and S3t are both closed so that the pre-pulses are applied only, through C10, to the base of the transistor Tr1 connected to the cathode K9 of the units tube Vu, while the base of this transistor is biased to non-conduction by returning it to the 2 v. positive line. The resistor R7 inhibits Tr2 from clamping the left-hand side of C10 to the collector voltage of Tr2. As S2u and S3u remain open then the gate circuit preceding tube Vu remains closed. If now eight sets of pulses, each set comprising a pre-pulse an A pulse and a B pulse, are caused to appear at the appropriate pulse lines, the tube Vt will be caused to step eight times and any "carry" operation necessary in the succeeding stages will be effected in the usual manner.

Similarly if it is required to count digits into the "hundreds" stage only then switches S2h and S3h are operated, all the other switches S2 and S3 remaining open, and the circuit will then proceed to count pulses in hundreds.

The main features of this circuit may conveniently be summarised as follows. First a positive pre-bias is applied to the gate circuit immediately before the stepping-tube to which the input is to be applied, so as permanently to open this gate circuit to the pre-pulses. Secondly, negative-going pre-pulses are applied to this gate circuit only and not to any of the other gate circuits. Thirdly, an inter-stage coupling circuit is provided between each gate in order that counts can be "carried" to each higher-order stage, but these coupling circuits must inhibit the application of pre-pulses in a "backward" direction.

FIGURE 2 illustrates an embodiment in which transistor Tr2 is a high-voltage transistor adapted to withstand a voltage of some 110 v. or more between its emitter and its collector. As explained in the above-mentioned application this enables the diode D2 to be dispensed with and the A guides GA of each tube, of which only the guides of tube Vt are shown in this figure, are connected directly to the collector of Tr2 and are also returned to the 150 v. negative line through resistor R5. In this arrangement the cathode K9 of the units tube Vu is connected to a resistor R10 which in turn is connectable through switch S2t to a 2 v. positive line. This arrangement, it will be seen, is in effect the same as that illustrated in FIGURE 1 and the omission of diode D2 does not affect the portion of the circuit with which the read-in facilities are connected.

FIGURE 3 is a further embodiment showing a circuit similar to that illustrated in FIGURE 1 but also embodying read-out facilities and also showing the connections for a chain of number-indicating tubes. In this arrangement the circuit as shown in FIGURE 3 is in the "count" position, that is to say the position in which it will receive and count normal unit pulses applied over the A, B and pre-pulse lines. When it is desired to read-out a number stored in the counting chain, that is to say when this number is to be displayed upon a chain of number-indicating tubes, switch S1 is switched to the "read-out" position. When it is desired to perform an addition by "reading-in" numbers onto the number already sorted in the counting-chain then switch S1 is switched to the "count" position and the appropriate switches S2 are operated and the appropriate read-in pulses are then applied to the counting-chain. Where a number of several figures, for example, three figures, is to be added to a number already stored in the counting-chain then it is possible to add in the appropriate number of "units" digits, the appropriate number of "tens" digits and the appropriate number of "hundreds" digits in through separate operations. For adding in "units" the switches S2u and S3u will be closed, for adding in "tens" digits the switches S2t and S3t will be closed, and for adding in the "hundreds" digits switches S2h and S3h will be closed.

Alternatively, the "units" pulses can be added in in one operation and the remainder of the addition performed in another operation by applying the appropriate number of pulses to the "tens" stage.

What we claim is:

1. A cold cathode stepping tube counting circuit comprising a chain of cold cathode stepping tubes arranged in cascaded stages, means applying a first series of counting pulses to each of said stages of said counter for storing a first number therein, a gating circuit connected between each pair of successive stepping tube stages for providing a carry from a lower tube to the next successive tube in ascending order, means for applying a second series of counting pulses to each of said stages, said second series representative of a plurality of digits of a multidigit-multiorder number, and inhibiting means connected to said gating means for inhibiting the passage of said second series of pulses to those counting stages of an order lower than the order of the applied digit in said multidigit-multiorder number.

2. A counting-circuit as claimed in claim 1 including a common counting pulse line and wherein each of said tubes includes at least one set of guides, and each of said gating circuits comprises a diode connected between said common counting pulse line and said set of guides of the stage succeeding the gating circuit, means for applying to the diode a blocking voltage preventing the diode from passing the said counting pulses, a first transistor, means for retaining the first transistor in a first state to provide said blocking voltage to said diode, means for switching said transistor to a second state to remove said voltage, said means being operable when a carry results from the stepping tube stage preceding the gating circuit to the stepping tube stage succeeding the gating circuit, and means for selectively unblocking one of said gating circuit diodes to cause counting in the stepping tube stages succeeding the selected gating circuit.

3. A counting-circuit as claimed in claim 1 wherein each gate further includes a second transistor for switching said first transistor from said first state to said second state, means for applying counting-pulses to the second transistor, means for inhibiting response of said second transistor to said counting pulses by applying a voltage to said transistor and means for selecting a gating circuit by removing said voltage from the second transistor of the selected gating circuit to cause response of said second transistor to said counting pulses.

4. A cold cathode stepping tube counting chain comprising, a plurality of gaseous discharge tubes arranged in a cascade of successively higher order stages, each of said tubes having a plurality of successively higher order representation cathodes and at least one cycling terminal for successively switching the said discharge along the respective order cathodes in ascending order, means applying a cycling pulse to the cycling terminal of the first of said stages, gating means interconnecting the cycling terminal of each subsequently higher order stage with the highest order cathode terminal of each preceding stage, said gating means including an input terminal for receiving control pulses, a first transistor having input, output and common electrodes, said input electrode being coupled to said terminal and to said highest order cathode of each of said stages but the last, a second transistor having input, output and common electrodes, the input electrode of said second transistor coupled to the output electrode of said first transistor, means coupling the common electrodes of both first and second transistors to a reference point, a first diode coupling the output electrode of said second transistor to the cycling terminal of the next successive stage in ascending order, a second diode coupling said means applying a cycling pulse to the cycling terminal of said next successive stage, means for biasing said diodes such that a pulse will reach the cycling terminal of said next successive stage upon the coincidence of first and second pulses to said first and second diodes, said second transistor switching said first transistor from said first state to said second state, means for applying counting-pulses to the second transistor, means for inhibiting response of said second transistor to said counting pulses by applying a voltage to said transistor, and means for selecting a gating circuit by removing said voltage from the second transistor of the selected gating circuit to cause response of said second transistor to said counting pulses.

References Cited

The following references, cited by the Examiner, are of record in the patented file of this patent or the original patent.

UNITED STATES PATENTS

| | | | |
|---|---|---|---|
| 2,595,045 | 4/1952 | Desch et al. | 328—51 X |
| 2,714,179 | 7/1955 | Thomas et al. | 315—84.6 |
| 2,793,806 | 5/1957 | Lindsmith | 328—51 |
| 2,975,329 | 3/1961 | Irving et al. | 315—84.6 |
| 3,212,009 | 10/1965 | Parker | 328—51 X |

JAMES W. LAWRENCE, Primary Examiner

V. LAFRANCHI, Assistant Examiner

U.S. Cl. X.R.

328—42